(12) United States Patent
Linnell

(10) Patent No.: US 8,130,554 B1
(45) Date of Patent: Mar. 6, 2012

(54) SECURELY ERASING FLASH-BASED MEMORY

(75) Inventor: Thomas E. Linnell, Northborough, MA (US)

(73) Assignee: EMC Corporation, Hopkinton, MA (US)

( * ) Notice: Subject to any disclaimer, the term of this patent is extended or adjusted under 35 U.S.C. 154(b) by 828 days.

(21) Appl. No.: 12/240,100

(22) Filed: Sep. 29, 2008

(51) Int. Cl.
*G11C 16/04* (2006.01)

(52) U.S. Cl. ............... 365/185.28; 365/185.29; 711/159

(58) Field of Classification Search ............ 365/185.28, 365/185.29; 711/159
See application file for complete search history.

(56) References Cited

U.S. PATENT DOCUMENTS

| | | | |
|---|---|---|---|
| 7,562,189 B2 * | 7/2009 | Hamilton et al. | 711/114 |
| 2003/0005248 A1 * | 1/2003 | Selkirk et al. | 711/165 |
| 2009/0164696 A1 * | 6/2009 | Allen et al. | 711/1 |

* cited by examiner

*Primary Examiner* — Hoai V Ho
(74) *Attorney, Agent, or Firm* — Krishnendu Gupta; Jason A. Reyes

(57) ABSTRACT

A method is used in securely erasing flash-based memory. A new version of data is received for a logical location of a flash-based memory. An old version of the data of the logical location is stored in a first physical location in the flash-based memory. The old version of the data is caused to be subject to an obscure operation. The new version of the data is caused to be stored in a second physical location in the flash-based memory.

19 Claims, 8 Drawing Sheets

SECURELY ERASING FLASH-BASED MEMORY

BACKGROUND

1. Technical Field

This application relates to securely erasing flash-based memory.

2. Description of Related Art

Many computing devices now include non-volatile memory (NVM), such as certain magnetic, semiconductor, and/or optical storage media, and including removable disk systems, hard drives, and other storage media systems allowing the device and/or a user to store data the device uses or is directed to use. In high security areas (e.g., military installations), there is often a requirement that data that had been stored on NVM of a device shall be completely or nearly completely inaccessible once the data is subject to being erased. Additionally, users in lower security areas often wish to erase data they would like to keep private or confidential for various reasons.

In a particular example, the currently prevalent method of deleting data constituting the contents of a file is to delete the pointers and/or directory information that allows the device to locate the data, which leaves the document images/data files themselves still resident in the NVM. This method usually does not meet the requirement that the data shall be completely or nearly completely inaccessible once the data is subject to being erased.

Lately, secure erase systems that overwrite the data with patterns of 1s, 0s, or random combinations thereof have come into use to meet erasure requirements. Government agencies and other customers have different requirements as to how many times one can overwrite the appropriate portions of NVM once a task is completed.

The characteristics of non-volatile, vibration-free, small size, and low power consumption have made a type of NVM known as flash memory an excellent component to be utilized in various flash storage devices. Flash storage devices are widely used as memory storage for computer and consumer system products such as notebook, desktop computer, set top box, digital camera, mobile phone, PDA and GPS etc. The increasing demand for more storage in these products has driven the need to expand the capacity of the flash storage devices.

There are at least two types of flash storage devices. A first type has a pre-defined mechanical dimension. This type includes: (a) Secure Digital (SD) card, (b) Multi Media Card (MMC), (c) Memory Stick (MS) card, (d) Compact Flash (CF) card, (e) Express Flash card, (f) Serial ATA Flash disk, (g) IDE Flash disk, (h) SCSI Flash disk, etc.

A second type of flash storage devices has no pre-defined physical dimension, which includes USB flash disk, Disk On Module (DOM), MP3 player etc. However, based upon the need for the system compactness, it is generally desirable to make this type of flash storage device as small in size and as high in capacity as possible.

Space constraints and available flash memory density are major obstacles in expanding the capacity of the flash storage devices. A secure digital (SD) card is defined with a form factor. This fixed dimension restricts the number of components populated on a printed circuit board (PCB). For instance, if thin, small out-line package (TSOP) type of flash memory is used, only a flash memory chip and a flash controller can be placed in the space constraint. The available flash memory density further limits the overall SD card capacity.

A flash memory die is the basic element of flash memory. A typical flash memory chip comprises a flash memory die mounted on a substrate within an enclosure and the electrical signals are bonded out to the metal contacts of the package. Popular package types for flash memory chip are TSOP, WSOP (Very Very Thin Small Out-line Package) and BGA (Ball Grid Array) etc.

Advances in semiconductor technology have lead to an increase in the use of a semiconductor solid state drive (also known as a solid state disk or SSD) which uses a flash memory as a storage device, in areas such as computer systems. Thus, in at least some cases there seems to be a trend towards the use of an SSD as a storage device instead of a magnetic disk. In spite of having features such as, for example, a relatively small storage capacity and a relatively high price, the SSD has some other features that can make it more attractive as a storage device than the conventional magnetic disk in at least some cases.

Features that can make SSDs preferable as storage devices are, for example, a fast access rate, high throughput, a high integration density, and stability against an external impact. SSDs can move much larger amounts of data and process far more I/O requests, per time period, than conventional magnetic disks. This allows users to complete data transactions much more quickly.

Furthermore, advances in manufacturing technologies for SSDs may reduce the production costs of SSDs and also increase the storage capacities of SSDs. These developments may provide further incentive to use SSDs in place of magnetic disks in at least some cases.

Solid state disk systems may also comprise communication controllers, such as Fibre Channel (FC) controllers, Ethernet mechanisms, ATA or serial ATA interfaces, or SCSI controllers for managing data communication with external computing devices.

With respect to its underlying technology today, flash memory is a kind of Electrically Erasable and Programmable Read Only Memory (EEPROM) and is largely divided into a NOR type flash memory supporting byte input/output (I/O) and a NAND type flash memory supporting only page I/O. The NOR type flash memory is often used as a memory for codes because of a fast read speed and a slow write speed, and the NAND type flash memory is often used as a bulk data storage unit because of a relatively fast write speed and a low cost per unit space.

Unlike a disk drive, for the flash memory, an erase operation must be performed in advance to perform a true rewrite operation, the flash erase operation is performed in a much greater block unit than a write operation, and the execution time of the flash erase operation is long. In at least some cases, these characteristics can impede the use of a file system or block-based system of a hard disk drive in the flash memory. To help solve this, a flash translation layer (FTL), which is a middleware between a disk file or block-based system and a flash memory, is provided. The FTL is an interface layer for freely reading and writing from and in a flash memory as a hard disk drive.

FIGS. 1-7 illustrate an example of a general hardware configuration of a device using a flash memory. The example is in the context of a file system but the same concepts also apply with a system that is block-based as well or instead. A central processing unit (CPU) 101 executes an application program stored in a Random Access Memory (RAM) 104 and issues a series of commands for a flash controller 102 to read or write data from or in a flash memory 103, and the flash controller 102 directly controls the flash memory 103.

FIG. 2 illustrates a software stack of a flash memory system using an FTL. The software stack includes an application 201, a file system 202, an FTL 203, and a flash memory 204. The file system 202, which has received a read/write request from the application 201, outputs a sector address, which is a read/write object, to the FTL 203, and the FTL 203 translates the sector address to a physical address (a block number and a page number) and outputs the physical address to the flash memory 204. (Where a block-based system is used instead of a file system, it may be a logical block address (LBA) that is translated to the physical address.)

As illustrated in FIG. 3, an FTL translates a sector address or number, which is a logical address of a virtual disk, to a block number and a page number, which is a physical address of a flash memory. In addition, as illustrated in FIG. 4, an FTL emulates a read/program/erase operation performed in a flash device similar to a read/write operation performed in a disk device.

An address translation of an FTL can be achieved using a virtual mapping table. A mapping method is largely divided into a page mapping method and a block mapping method. The page mapping method performs the address translation in a page basis (less than 2 KB), and the block mapping method performs the address translation in a block basis (less than 128 KB).

FIG. 5 illustrates an address translation mechanism according to the block mapping method. For example, a logical address "sector 6" is divided into a logical block number and a logical offset, respectively mapped to a physical block number and a physical offset, and translated to "page2 of block0" of a flash memory.

Since an FTL provides emulation to show the flash device as a randomly readable/writable disk using the block mapping method, a disk-based file system, such as a file allocation table (FAT) file system, can be located above the FTL. FIG. 6 illustrates a structure of an FAT table of an FAT file system, wherein a file is represented as a linked list of addresses in which real data is stored, and this file information is managed as a table. Referring to FIG. 6, FAT entries 0, 1, and 5 indicate free areas in which data is not recorded, a file A is stored in an area indicated by FAT entries 4, 7, and 2, and a file B is stored in an area indicated by FAT entries 6 and 3. The FAT table is stored in a beginning portion of a disk separately from an area in which contents of files are stored. In an ordinary delete operation, when a file is deleted, only the FAT table is updated, and contents in real data blocks corresponding to the deleted file indicated by the FAT table remain.

In other words, when an FAT file system is used as an upper layer of an FTL, when performing an ordinary file deletion, a relevant file is not really deleted but only a FAT table and a directory entry corresponding to the file are updated, and therefore the FTL, which is a lower layer, does not know that sectors of the deleted file are invalid. Likewise, in most other file systems, only metadata of a deleted file is updated, and data of sectors in which the file has been actually recorded remains in a flash memory.

An FTL provides abstraction to allow a flash memory to be logically rewritten. In reality, when a rewrite occurs, data must be recorded in a free space of the flash memory, and if free space does not exist, a garbage collection or merge operation for generating new free blocks must be performed, which can slow down processing.

By analogy, in devices such as SSDs, which are addressed by logical block numbers instead of file pointers, a similar mechanism is used to track the latest valid version of a block, so that, when a block is "deleted" or overwritten, the relevant flash pages are marked as invalid in a table, and the new data is written to a block that is in a free list.

FIG. 7 illustrates an example garbage collection process of an FTL. Here, data of one logical block can be recorded in a maximum of two blocks (a data block and a log block), and when data cannot be rewritten in the two blocks any more due to continuous rewrite operations, a merge operation for merging the two blocks into one is performed, and then a rewrite operation proceeds. That is, in FIG. 7, the data block and the log block become erasable blocks after being merged to a free block. According to this mechanism, the time for performing a block copy operation and two flash erase operations is required for a sector write operation. In addition, if a file is deleted ordinarily from a file system, only metadata, such as an FAT table, is updated, and an actual data block remains as is, and accordingly, the FTL recognizes all data of the deleted file as a valid page and copies them too.

Flash memory may be used in one or more multiple locations in a computer system. For example, computer systems may include different flash memory based resources used by one or more host processors. Such resources and host processors in a computer system may be interconnected by one or more communication connections. These flash memory based resources may include, for example, data storage devices such as those included in the data storage systems manufactured by EMC Corporation. These data storage systems may be coupled to one or more servers or host processors (also known as hosts) and provide storage services to each host processor. Multiple data storage systems from one or more different vendors may be connected and may provide common data storage for one or more host processors in a computer system.

State of the art systems require ever increasing on-line storage capacity and reliability without a corresponding detrimental impact on speed. In order to provide access to such ever increasing volumes of data at a reasonable speed and cost, many technologies have been developed for use in data storage systems. One very popular storage technology is redundant arrays of inexpensive disks (RAID), which may include one or more SSDs, for example.

The technology behind RAID includes both a general hardware architecture and a disk array controller firmware architecture. With respect to the disk controller firmware architecture, one of the more popular architectures is RAID Level 5. The RAID Level 5 architecture, as well as RAID generally and the various RAID Levels, are described in detail in Patterson et al., "A Case for a Redundant Arrays of Inexpensive Disks (RAID)", ACM SIGMOD Conference, Chicago, Jun. 1-3, 1988, incorporated herein by reference.

As described therein, disk data are divided into stripes. For example, a RAID Level 5 disk set may include four disks, DISK1-DISK4, and a stripe width of five blocks. Stripes 1, 2, and 3 contain data of two kinds, host data D and meta-data P. Host data D, which is the information stored, retrieved and manipulated by the host computer, is for convenience referred to hereinafter simply as data D. Meta-data P is used exclusively by the disk array controller and perhaps other disk subsystem components for the control and maintenance of the disk array system. For example, one type of meta-data P may be parity information. Stripes are recorded as sequential blocks on a plurality of different disk drives. Each stripe includes a plurality of data blocks D and one additional set of blocks called parity blocks P. The parity blocks P contain the logical exclusive-OR (XOR) of the plurality of data blocks D, and is recorded on an additional disk drive. Conventionally, the parity blocks P are distributed among all the disk drives of an array in order to avoid drive contention during write operations. The use of parity blocks P improves availability of all of the data in a stripe. When one drive is unavailable, for example, the missing data block from a stripe can be reconstructed from the parity block and the available data blocks. The contents of the parity block is simply XORed with the data blocks remaining. The result of this XOR operation is the data from the missing drive. Once such a drive has been repaired, data can be restored to the repaired drive using the parity blocks and data blocks from each good drive in similar fashion.

A typical RAID-based disk controller 1010 is shown in FIG. 11. The controller is connected to a host computer (not shown), through a host port 1030. Input/output (I/O) transactions are received through the host port by a host I/O processor 1050. The host I/O processor is responsible for receiving commands from the host computer to the RAID array and for transferring data and command status responses from the RAID array back to the host computer. Commands from the host computer are typically requests to perform an operation on a number of blocks, i.e., a logical block count (LBC), beginning with a specified logical block address (LBA) within the RAID array.

The RAID disk controller also has a disk array interface port 1070 which communicates with a plurality of physical disk drives 1090. Data I/Os and other commands to be executed by the physical disk drives of the RAID array are processed by a disk array I/O processor 1110 executing RAID Level 5 algorithms. The host commands relating to logical locations (LBA, LBC) are processed into a plurality of physical I/O operations which are in turn processed by a physical disk handler 1150 into physical I/O commands for specific physical disk drives 1090. For example, a disk write of several blocks may be organized into stripes and divided into individual disk I/O operations. Such common operations are described in detail in Patterson et al.

In order to improve the efficiency of RAID controllers, it has become a common practice to provide a cache 1130, logically disposed between the host I/O processor 1050 and the disk array I/O processor 1110. (Cache 1130 may include one or more types of flash memory.) For example, Row et al. In U.S. Pat. No. 5,163,131, issued Nov. 10, 1992, describe an architecture for a large file server including a front end cache. Goodlander et al. disclose a front end caching system in the context of a data storage system including a plurality of disk drives, in U.S. Pat. No. 5,257,367. The caching system 1130 is typically a separate software process or set of subroutines using the same system logical block references as the host I/O processor 1050 because the data cached is that data frequently requested by the host computer. Therefore, use of logical block references by the cache 1130 is most efficient. Caching of data is helpful because the host may request data from the same logical location many times without modification. When such frequently requested data is found in the cache 1130, it may be sent to the host port by the host I/O processor 1050 without having to perform a physical I/O to the RAID array. Such a cache 1130 may also be helpful during write operations because valid old data which has been previously cached need not be retrieved from the physical disks to be XORed with the parity stripe before overwriting. The valid old cached data can be XORed with the parity stripe and then the new data both cached and written to the physical disks.

SUMMARY OF THE INVENTION

A method is used in securely erasing flash-based memory. A new version of data is received for a logical location of a flash-based memory. An old version of the data of the logical location is stored in a first physical location in the flash-based memory. The old version of the data is caused to be subject to an obscure operation. The new version of the data is caused to be stored in a second physical location in the flash-based memory.

One or more implementations of the invention may provide one or more of the following advantages.

Sensitive information, such as Social Security Numbers, held in flash memory can be securely erased from the flash memory without an excessive adverse effect on performance.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
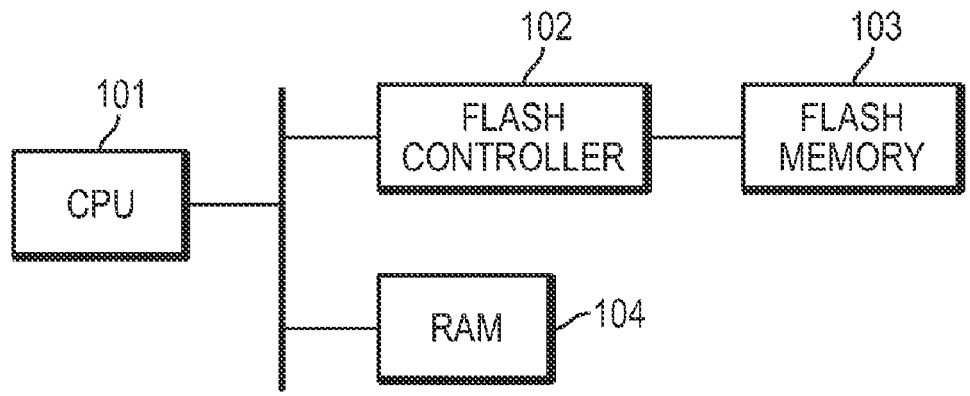
FIG. 1 illustrates a general hardware configuration of a device using a flash memory.
Figure 2:
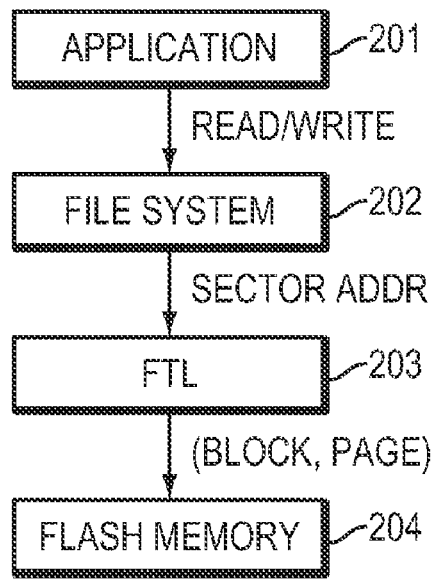
FIG. 2 illustrates a software configuration of a flash memory system using a flash translation layer (FTL)
Figure 3:
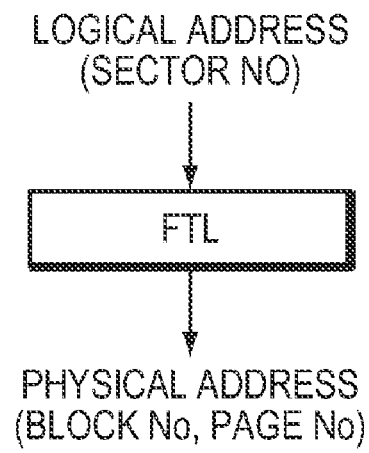
FIG. 3 illustrates an address translation mechanism of an FTL.
Figure 4:
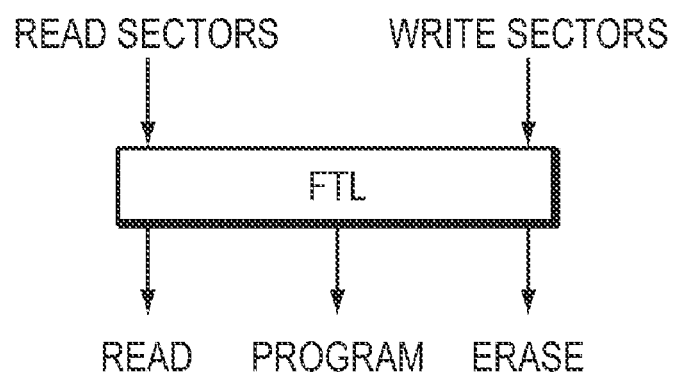
FIG. 4 illustrates operations of an FTL.
Figure 5:
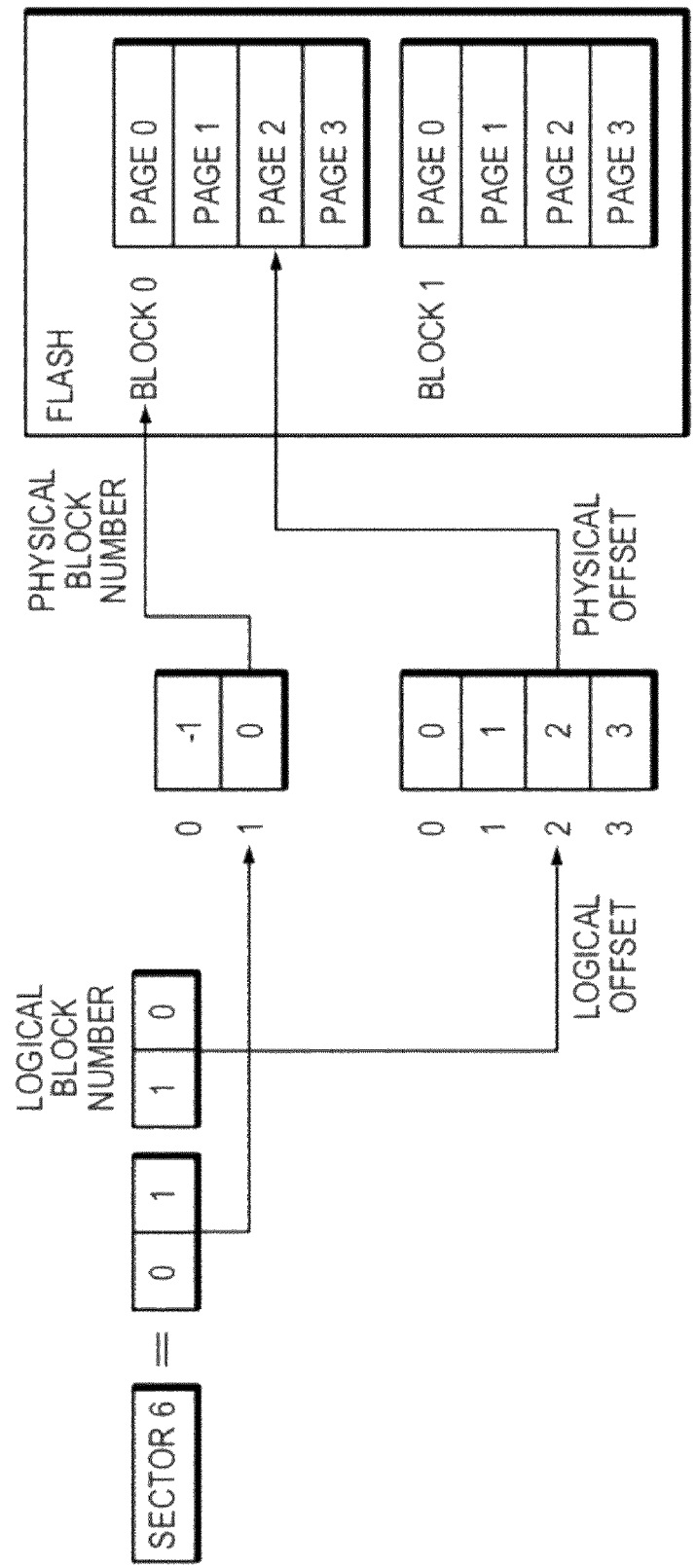
FIG. 5 illustrates a block mapping method of an address translation mechanism of an FTL.
Figure 6:
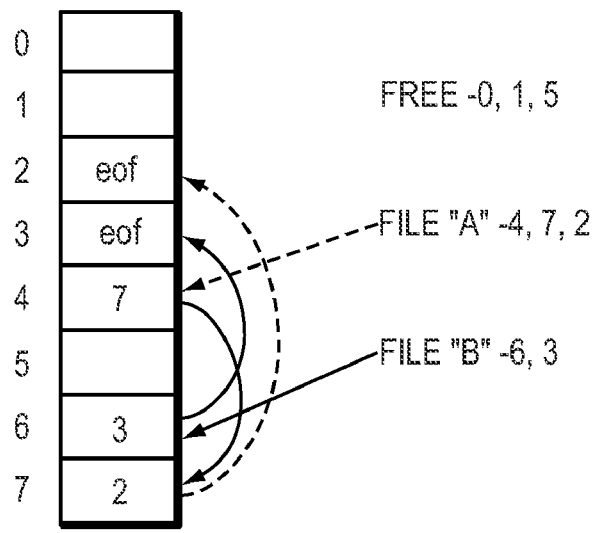
FIG. 6 illustrates a structure of an FAT table.
Figure 7:
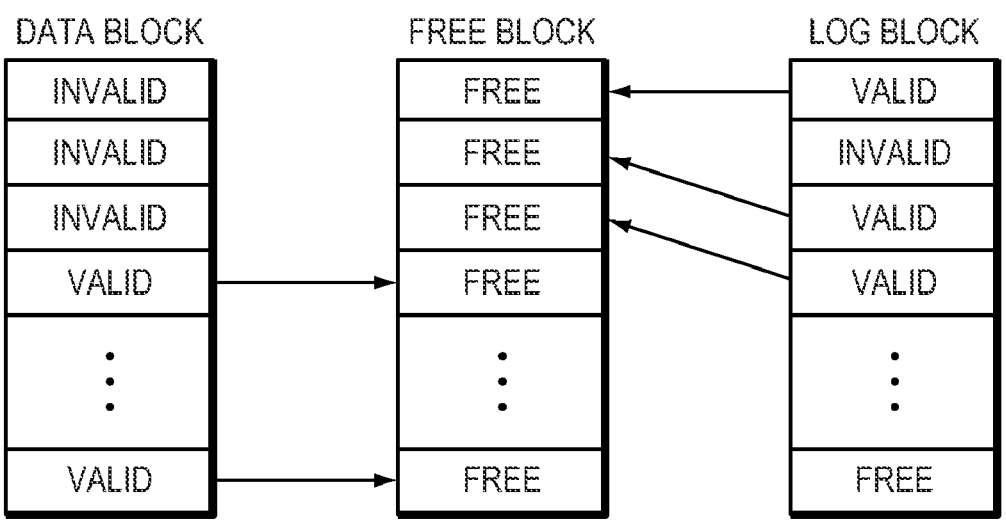
FIG. 7 illustrates a garbage collection process of an FTL.

In accordance with a secure erase technique as described below, a page-level secure erase capability can be provided for flash memory devices. In particular, a mechanism can be provided for securing the contents of flash media such that updates of new data do not leave copies of older data within the flash media. Conventional flash media supports secure erase at the device level, but merely overwriting existing data in conventional flash media with, for example, "0"s, does not physically delete the information in the device. By contrast, the secure erase technique described herein allows a host to effectively overwrite data so that the existing data is satisfactorily deleted, and enables a logical (i.e., less than an entire device) secure erasure function.

The secure erase technique may be used in one or more of many different types of computing environments. For example, in a data storage system computing environment, the secure erase technique may have use case requirements as now described.

There are at least three significant use cases for disk-level security erase in data storage systems (also known as storage arrays or arrays). The first case (Case 1) is full array erasure, which is useful for repurposing and/or decommissioning an array. The second case (Case 2) is full disk erasure, which is useful for repurposing and/or decommissioning a disk drive. The third case (Case 3) is logical unit erasure, which is useful for deleting data in an operational system.

Conventional flash based disks such as SSDs support a conventional secure erase function which erases entire flash chips within the drive (Cases 1 and 2, above) but cannot satisfactorily deal with logical block level erasure (this is also referred to herein as the logical erasure problem, described below). At least in part, this is because, in conventional flash based disks, newly written data does not delete older data, and older data is not erased until the flash block it resides in is reclaimed in garbage collection (and/or defragmentation) or rebalancing due to wear-leveling.

The secure erase technique described herein supports erasure of logical data blocks in at least NAND flash based memory.

Now described is an overview of the logical erasure problem. In at least some conventional flash media such as current NAND flash based memory, data that is overwritten on the flash media is not immediately deleted, due to the granularity structure of erase, and the fact that the flash media can only be "programmed", not written (i.e., the state of bits can be changed in only one direction). The net effect, conventionally, is that old copies of data continue to persist in a logically invalid (but physically real and technologically accessible) state until such time as the entire block that it is written in is reclaimed and truly erased. Also, logically contiguous data may not be physically contiguous; in the event that blocks need to be erased immediately to delete information, conventionally it may create a large amount of background overhead. For example, consider an eight sector logical extent that is written once, and then each sector is rewritten once, and then the eight sectors are deleted. In the conventional flash media, the logical extent now exists in nine distinct flash blocks, the first containing the entire (now invalidated) extent, and the eight new blocks, each containing 1 updated sector, and 63 pages of other data. For removal, conventionally it is necessary to copy back the valid data on these nine blocks to a new location, and then erase them in turn. Larger extents conventionally impact proportionally larger numbers of blocks, depending on the age of the data and update frequency. It is also necessary conventionally for the disk system to keep track of all of the previously used locations for each logical sector. Thus, for example, as a result of the logical erasure problem, conventionally it can be difficult to preserve some data on an SSD while at the same time satisfactorily erasing other data on the SSD; thus, for example, on an array, it can be difficult conventionally to satisfactorily erase data for one completed project without adversely affecting data for another, ongoing project. Also, for example, as a result of the logical erasure problem, if a type of logical volume ("LUN") referred to as a virtual LUN relies on a pool made up of portions of other LUNs, conventionally it can be difficult to satisfactorily erase data of the virtual LUN without adversely affecting data of other LUNs.

In accordance with the secure erase technique, an operation referred to as "obscure" may be used to help address the logical erasure problem. In an example implementation of the obscure operation, on a deletion request the affected sector is reprogrammed to an all "0"s state to obscure the original contents, and the invalid state is set for that location, but a migration/erasure cycle is not required. This is possible to do on a page, for a limited number of times between erase cycles, and is appropriate for bytes which need never be recovered. To avoid requiring that the entire history of a particular LBA be tracked, the drive may operate in a "secure mode" which forces an obscure operation on the old data for every write to flash (which in at least some implementations may adversely affect performance). For an overwrite operation, the hosting system can write "0"s to the target locations, and the disk deletes (through the obscure operation) the old data and always returns "0"s on references. In the end, the block is eventually recycled, e.g., through garbage collection and/or defragmentation, either because little valid data remains, or a wear leveling process determines to reuse it.

Figure 8:
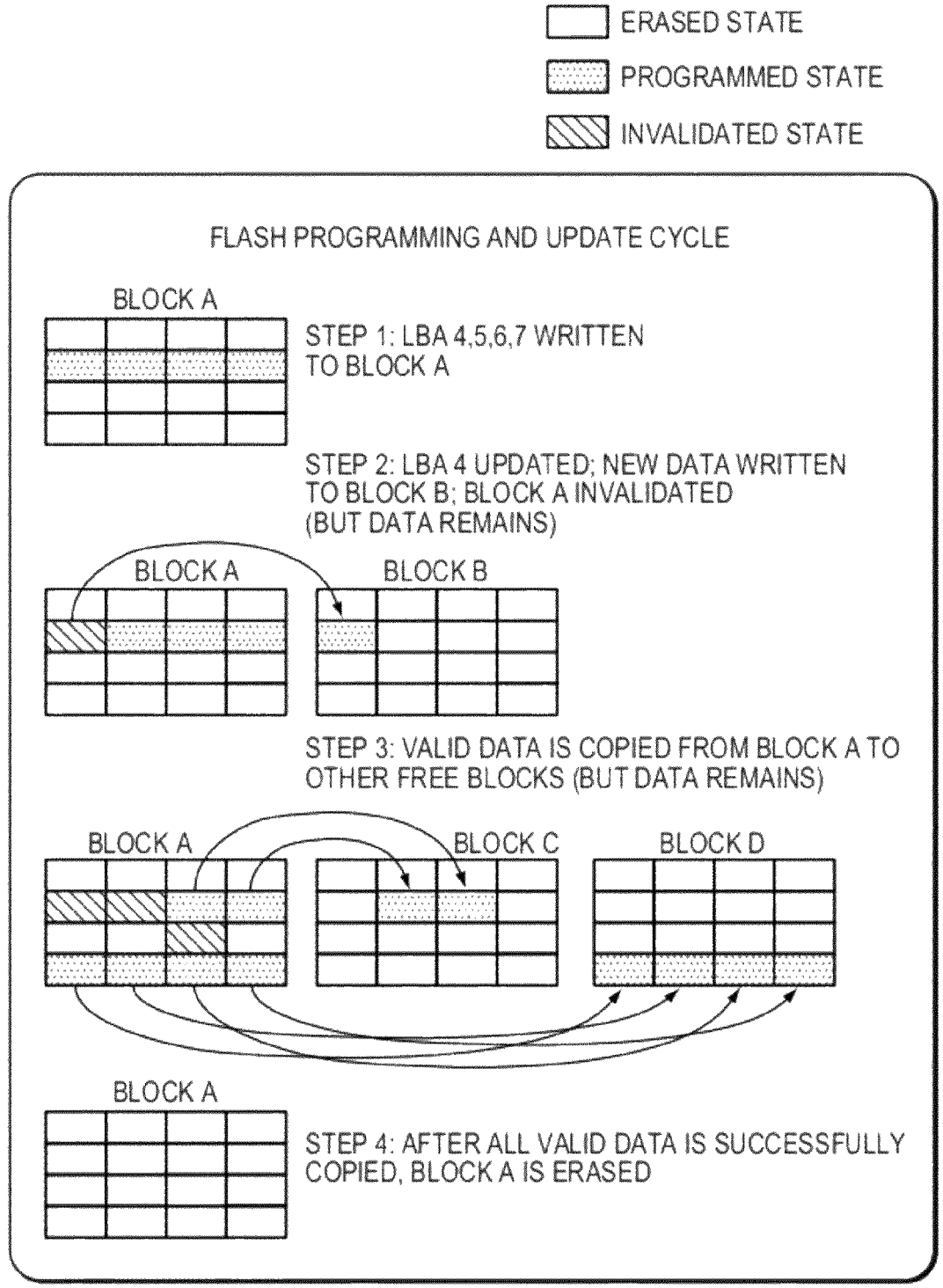
FIGS. 8-10 illustrate examples of procedures for use with at least a portion of the general hardware of FIG. 1.

FIG. 8 helps to illustrate the logical erasure problem in a conventional NAND flash update sequence, now described. When initial data (e.g., LBA 4, 5, 6, 7) is written to a flash block (e.g., Block A) (Step 1), it is programmed into a first location in an erased area. If that data is rewritten (Step 2), the new version of the data is written to a second location (e.g., Block B), and the first location is marked as invalid, but the old version of the data remains in the first location. Additional rewrites lengthen the chain to create multiple invalid copies, and before the flash block can be erased, other valid data in that block needs to be copied to new locations, because the flash block must be erased in its entirety (Steps 3, 4). As the size of the extent grows, such entanglements grow geometrically.

Figure 9:
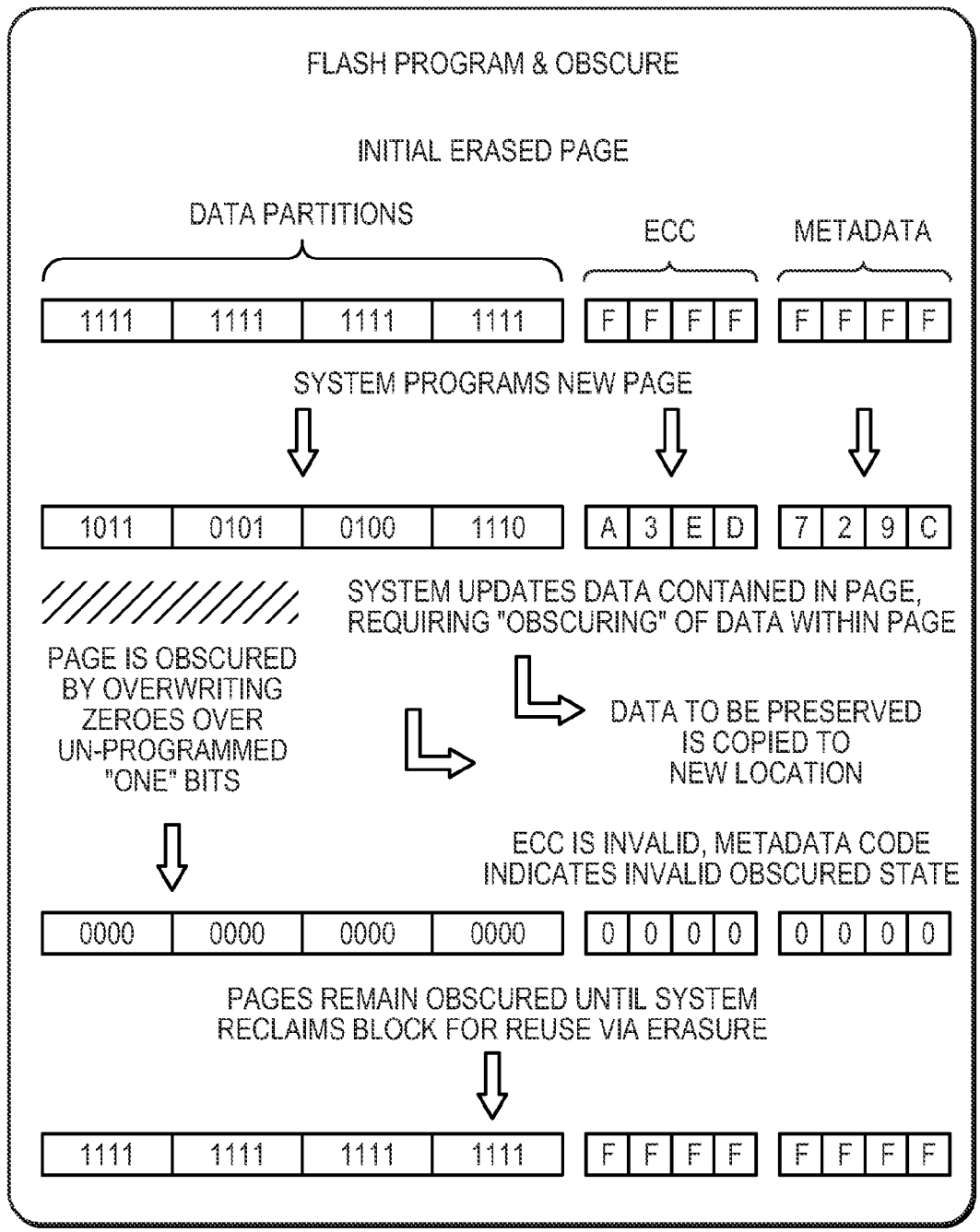

FIG. 9 illustrates an example of the obscure operation in a NAND flash update sequence. In NAND flash, data can only be "programmed", i.e., bits can only change state in one direction. Erasing changes all the bits in a block to "1"s. Programming can only change selected bits to "0"s. In an example implementation, each page includes not only data but also metadata and error correcting code redundancy data ("ECC"). Once the ECC is written with the data, it also cannot be changed, only obscured. The obscure operation is performed at page-level granularity. A partial page reprogramming feature allows new "0"s to be set, but existing "0"s cannot be modified, and the number of partial reprogramming cycles is limited (e.g., to 4) between erasures due to program disturb effects.

Figure 10:
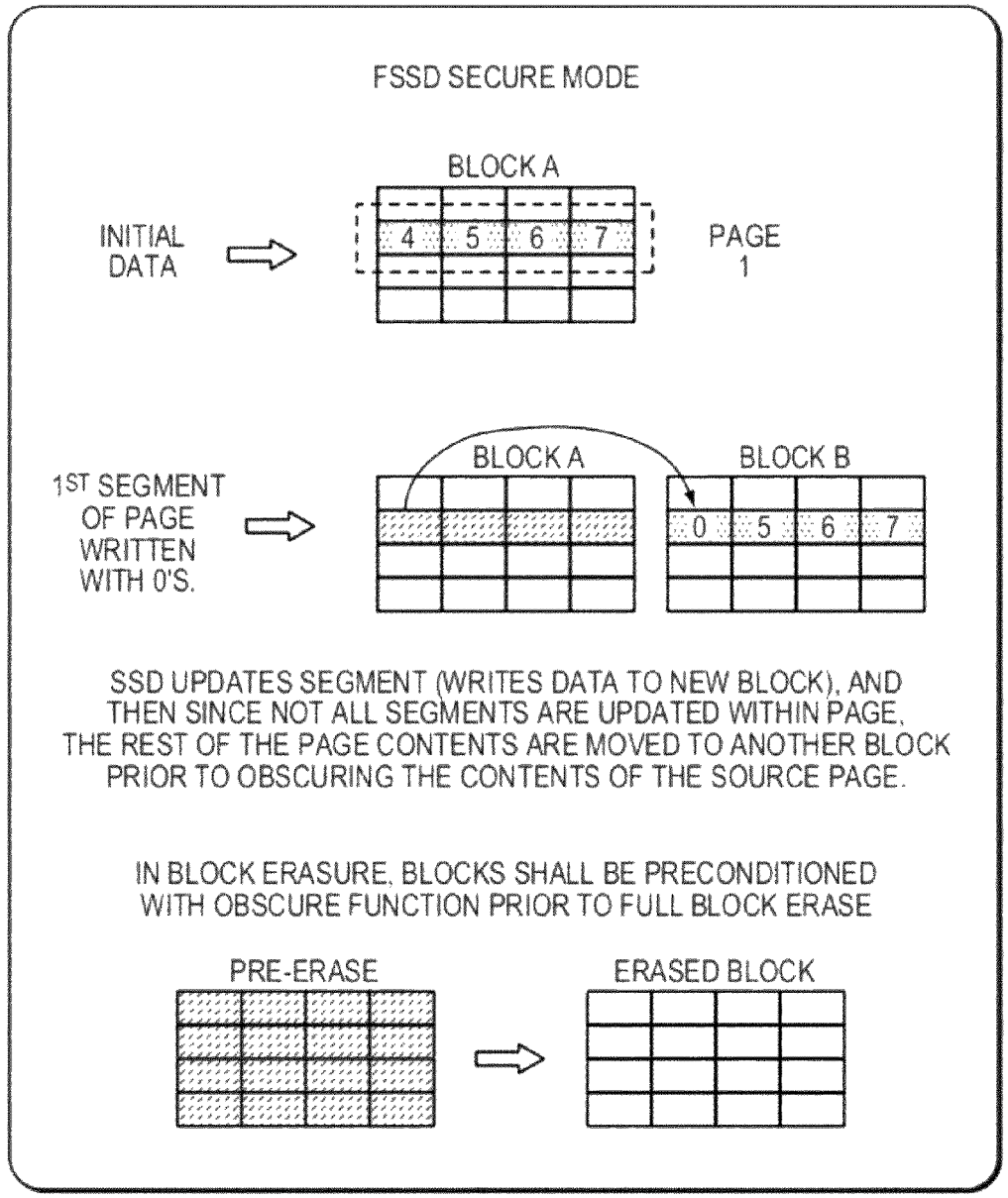
Figure 11:
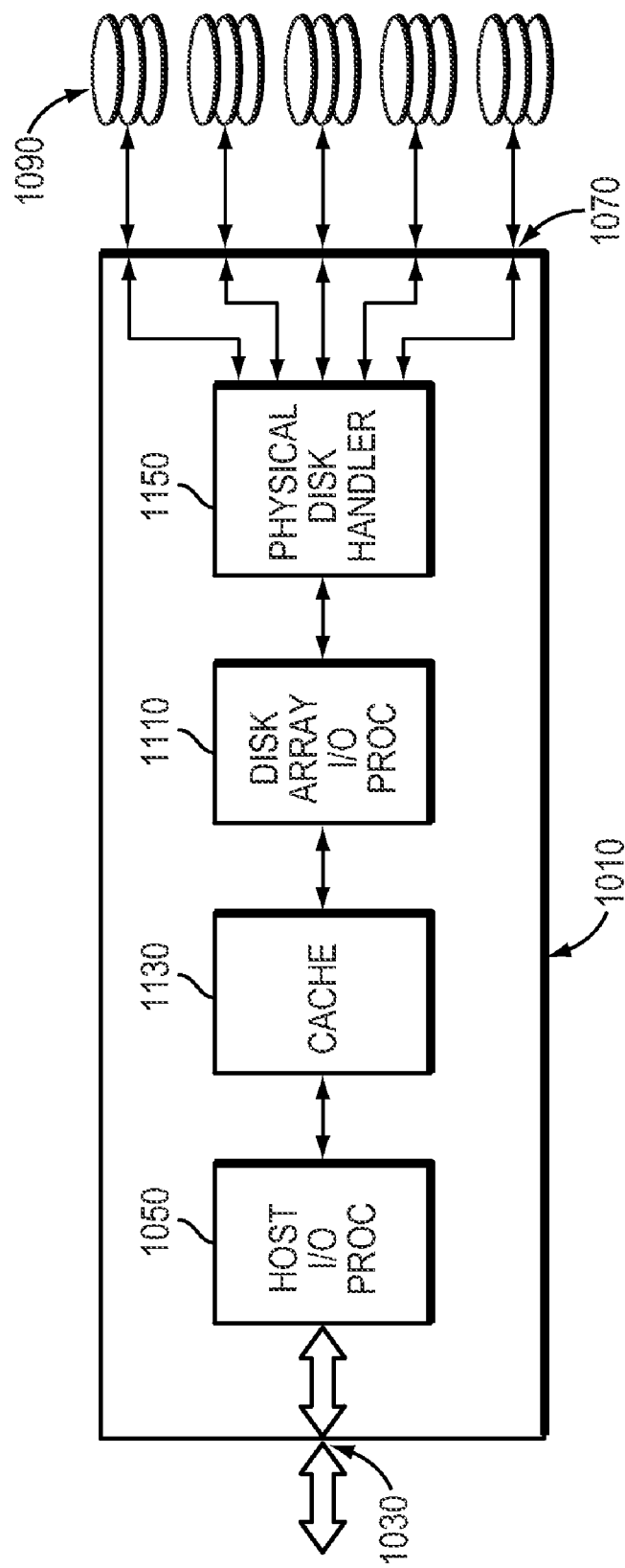
FIG. 11 illustrates an example data storage system that may use at least a portion of the general hardware of FIG. 1.

FIG. 10 illustrates by example that in the secure mode, all write updates to a device obscure the previous version of the data. For logical erasure, the system issues an overwrite command of "0"s, which forces existing data to be obscured and new data to be cleared to "0"s. In at least some implementations, blocks scheduled for erasure that contain unobscured data are completely obscured prior to erasure, so that failures that occur in the erase cycle do not cause clear data to remain in blocks that are retired from service.

At least one implementation may have one or more of the following characteristics. The obscure operation may also cause, with respect to ECC data corresponding to obscured data, at least some ECC "1"s to be programmed to "0"s to prevent or impede use of the ECC to reconstruct the obscured data. If a conventional overwrite procedure is used in or with an implementation of the secure erase technique, such a procedure may overwrite with "0"s so that the last good read of data from the logical location returns zero and therefore matches all old, now obscured, versions of that data. Secure write commands and/or command to select or deselect secure mode may be interpreted by the FTL, and/or the flash device may make appropriate device level functions, such as the obscure operation, capable of being invoked by software or other logic outside of the device or the FTL layer. At least some obscure operations may be executed in the background, e.g., directed to areas previously marked for obscuring, under the same mechanisms that help invoke and schedule garbage collection.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for use in securely erasing flash-based memory, the method comprising:

receiving a new version of data for a logical location of a flash-based memory, an old version of the data of the logical location being stored in a first physical location in the flash-based memory;

causing the old version of the data to be subject to an obscure operation; and causing the new version of the data to be stored in a second physical location in the flash-based memory.

2. The method of claim 1, further comprising:
applying garbage collection to the first physical location.

3. The method of claim 1, wherein the first physical location comprises NAND flash based memory.

4. The method of claim 1, wherein the contents of the first physical location continues to persist in a technologically accessible state until a block containing the first physical location is erased.

5. The method of claim 1, further comprising:
applying partial programming to the first physical location.

6. The method of claim 1, further comprising:
programming an unprogrammed bit at the first physical location.

7. The method of claim 1, further comprising:
reprogramming the first physical location to an all "0"s state.

8. The method of claim 1, further comprising:
setting an invalid state for the first physical location.

9. The method of claim 1, further comprising:
forcing an obscure operation on old data for every write to the flash-based memory.

10. The method of claim 1, further comprising:
for an overwrite operation, writing "0"s to the logical location.

11. The method of claim 1, wherein bits in the flash-based memory can only change state in one direction.

12. The method of claim 1, further comprising:
subjecting error correcting code redundancy data to the obscure operation.

13. The method of claim 1, wherein the obscure operation is performed at page-level granularity.

14. The method of claim 1, further comprising:
causing all write updates to the logical location to obscure the old version of the data.

15. A system for use in securely erasing flash-based memory, the system comprising:

first logic receiving a new version of data for a logical location of a flash-based memory, an old version of the data of the logical location being stored in a first physical location in the flash-based memory;

second logic causing the old version of the data to be subject to an obscure operation; and third logic causing the new version of the data to be stored in a second physical location in the flash-based memory.

16. The system of claim 15, further comprising:
fourth logic applying garbage collection to the first physical location.

17. The system of claim 15, wherein the first physical location comprises NAND flash based memory.

18. The system of claim 15, wherein the contents of the first physical location continues to persist in a technologically accessible state until a block containing the first physical location is erased.

19. The system of claim 15, further comprising:
fifth logic applying partial programming to the first physical location.

* * * * *